United States Patent

Kodama et al.

Patent Number: 5,291,447
Date of Patent: Mar. 1, 1994

[54] SEMICONDUCTOR MEMORY DEVICE HAVING FUNCTION OF CONTROLLING SENSE AMPLIFIERS

[75] Inventors: Yukinori Kodama; Yasuhiro Fujii, both of Kawasaki, Japan

[73] Assignee: Fujitsu Limited, Kanagawa, Japan

[21] Appl. No.: 921,155

[22] Filed: Jul. 29, 1992

[30] Foreign Application Priority Data

Jul. 30, 1991 [JP] Japan .................. 3-190100

[51] Int. Cl.$^5$ .............................................. G11C 7/00
[52] U.S. Cl. ................................... 365/190; 365/207
[58] Field of Search .............. 369/190, 207, 208, 205, 369/149, 189.05, 227

[56] References Cited

U.S. PATENT DOCUMENTS

| | | | |
|---|---|---|---|
| 4,769,564 | 9/1988 | Garde | 365/208 |
| 4,799,196 | 1/1989 | Takemae | 365/190 |
| 4,804,871 | 2/1989 | Walters | 365/190 |
| 5,029,137 | 7/1991 | Hoshi | 365/190 |
| 5,128,896 | 7/1992 | Yamada | 365/190 |
| 5,148,399 | 9/1992 | Cho | 365/205 |
| 5,193,075 | 3/1993 | Hatano | 365/190 |

Primary Examiner—Eugene R. LaRoche
Assistant Examiner—A. Zarabian
Attorney, Agent, or Firm—Nikaido Marmelstein Murray & Oram

[57] ABSTRACT

A semiconductor memory device includes a memory cell array including a plurality of memory cells provided in the form of a matrix along a plurality of word lines and a plurality of pairs of bit lines, a plurality of sense amplifiers operatively connected to the plurality of pairs of bit lines, and a sense amplifier control unit operatively connected to the plurality of sense amplifiers. When one of the plurality of memory cells is selected and data writing is carried out to the selected memory cell, the sense amplifier control unit selectively inactivates only a sense amplifier corresponding to the selected memory cell among the plurality of sense amplifiers. Thus, it is possible to remove useless dissipation of write current in the data write operation to thereby decrease the dissipated power, while realizing a high speed write operation.

6 Claims, 6 Drawing Sheets

SEMICONDUCTOR MEMORY DEVICE HAVING FUNCTION OF CONTROLLING SENSE AMPLIFIERS

BACKGROUND OF THE INVENTION

1. Field of the Invention

The present invention relates to a semiconductor memory device. More particularly it relates to a technique of controlling a sense amplifier in a dynamic random access memory (DRAM) in a data write operation thereof and thereby improving performance thereof in the write operation

2. Description of the Related Art

A typical DRAM device includes a write amplifier circuit which amplifies complementary write data input from the outside of the device and transmits the amplified data via complementary data lines to a selected pair of complementary bit lines, together with a sense amplifier provided for each pair of a plurality of pairs of bit lines. In a general design of the device, the current drive ability of each transistor used in the write amplifier circuit is selected to be much higher than that of each transistor used in the individual sense amplifier. This is because, where the current drive ability of each transistor used in the individual sense amplifier is designed to be relatively high, an area occupied by the respective sense amplifiers n a chip is increased.

In this connection, a prior art DRAM device carries out its write operation utilizing the difference between the above current drive abilities. In this case, there is no problem where the device writes data of a logical level same as data latched in the sense amplifier.

A problem occurs, however, where the device writes data of a logical level opposite to data latched in the sense amplifier. In this case, the device must invert the latched state of the sense amplifier with the sense amplifier being activated. Accordingly, past of the write current fed from the write amplifier circuit leaks through the activated sense amplifier until the latched state is perfectly inverted. Thus, a problem occurs in that power is uselessly dissipated and it takes considerable time to invert the latched state of the sense amplifier. This leads to a prolongation access time in the write operation and thus is not desirable.

Note, the problems in the prior art will be explained later in detail in contrast with the preferred embodiment of the present invention.

SUMMARY OF THE INVENTION

An object of the present invention is to provide a semiconductor memory device which can remove useless dissipation of write current in the data write operation to thereby decrease power dissipated therein, while realizing a high speed write operation thereof.

According to the present invention, there is provided a semiconductor memory device including memory cell array including a plurality of memory cells provided in the form of a matrix along a plurality of word lines and a plurality of pairs of bit lines; a plurality of sense amplifiers operatively connected to the plurality of pairs of bit lines; and a sense amplifier control unit operatively connected to the plurality of sense amplifiers, when one of the plurality of memory cells is selected and data writing is carried out to the selected memory cell, for selectively inactivating only a sense amplifier corresponding to the selected memory cell among the plurality of sense amplifiers.

BRIEF DESCRIPTION OF THE DRAWINGS

Other objects and features of the present invention will be described hereinafter in detail by way of preferred embodiments with reference to the accompanying drawings, in which.

DESCRIPTION OF THE PREFERRED EMBODIMENTS

Throughout the description, identical references used in connection with the drawings indicate like constituent elements and thus the repetition of explanation thereof is omitted.

First, for a better understanding of the preferred embodiment of the present invention, the related prior art will be explained with reference to FIG. 1.

Figure 1:
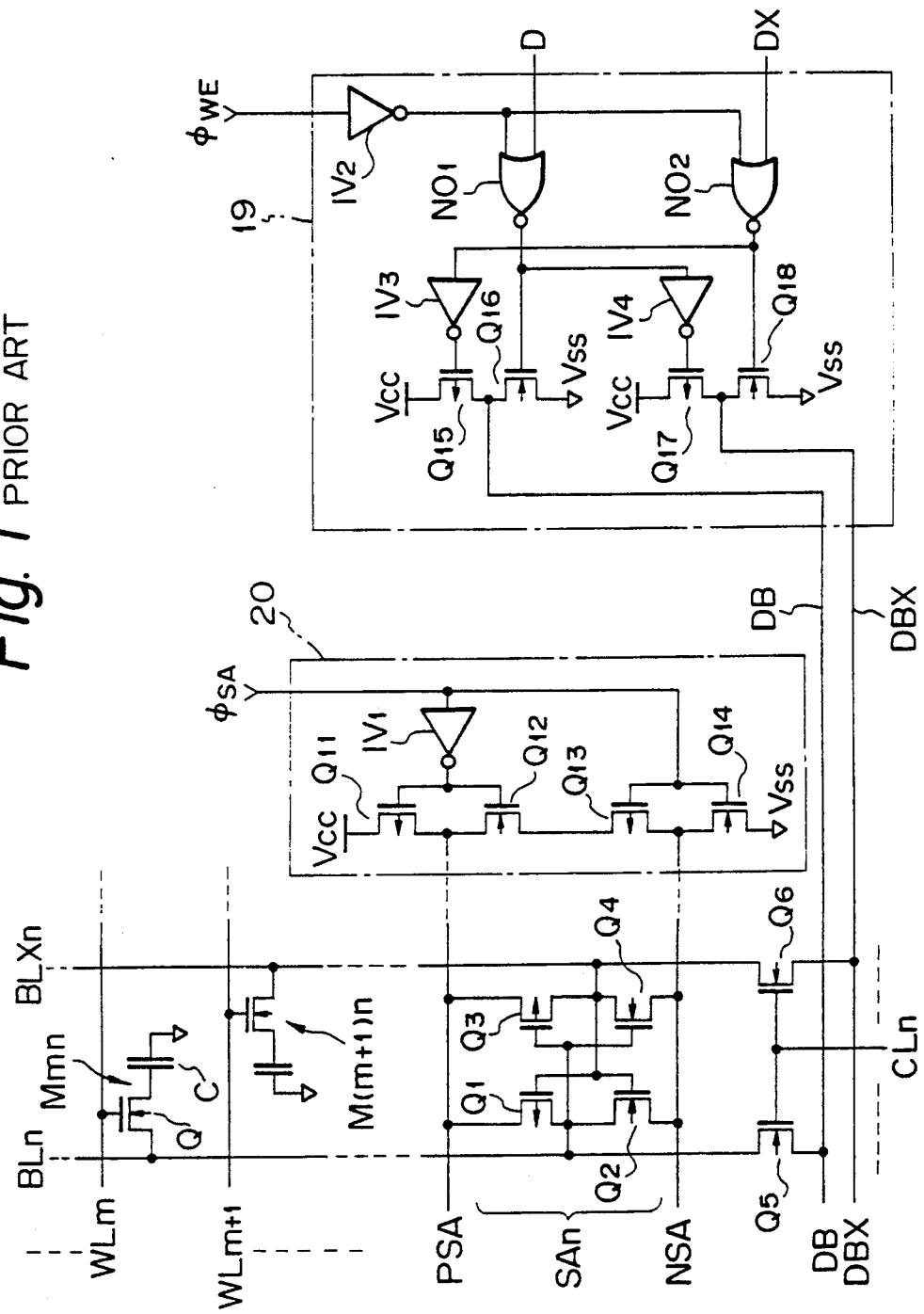
FIG. 1 is a circuit diagram showing a constitution of a data input/output portion in a prior art DRAM device.

FIG. 1 illustrates a circuit constitution of a data input/output portion in a prior art DRAM device.

In a typical operation of the DRAM, when a potential of a word line (WLm) selected by a row address input is changed from "L" level to "H" level, a cell transistor (Q) in a memory cell (Mmn) connected to the word line is turned ON. As a result, charges stored in a cell capacitor (C) cause a difference voltage to be generated between complementary bit lines (BLn, BLXn) which have been at an equal potential up to that time. In this case, since a capacitance of the cell capacitor is generally much smaller than a parasitic load capacitance of the bit lines, the difference voltage between the bit lines is also very small accordingly. To cope with this, a sense amplifier (S/A) SAn is connected across the bit lines to amplify the difference voltage, as shown in FIG. 1. Moreover, a S/A driver circuit 20 is provided to drive the sense amplifier SAn.

The sense amplifier SAn is comprised of four transistors, i.e., two p-channel transistors $Q_1$, $Q_8$ and two n-channel transistors $Q_2$, $Q_4$, constituting a CMOS flip-flop. Also, the S/A driver circuit 20 includes a p-channel transistor $Q_{11}$, an n-channel transistor $Q_{12}$, a p-channel transistor $Q_{13}$ and an n-channel transistor $Q_{14}$ connected in series between power supply lines Vcc and vss, and an inverter $IV_1$ responsive to a sense amplifier activation signal $\phi_{8A}$. The transistors $Q_{11}$ and $Q_{13}$ respond to an output of the inverter $IV_1$, and the transistors $Q_{13}$ and $Q_{14}$ respond to the sense amplifier activation signal $\phi_{8A}$. Also, the sense amplifier SAn is connected between a drive signal line PSA of higher voltage (drains of the transistors $Q_{11}$ and $Q_{12}$) and a drive signal line NSA of lower voltage (drains of the transistors $Q_{13}$ $Q_{14}$).

In the above constitution, when a difference voltage is generated between the bit lines BLn, BLXn and then the sense amplifier activation signal $\phi_{SA}$ is changed to "H" level, the transistors $Q_{11}$ and $Q_{14}$ are turned ON. As a result, potentials of the drive signal lines PSA and NSA are changed to "H" level and "L" level, respectively. According to the difference voltage between the bit lines BLn and BLXn, the sense amplifier SAn causes the potential of a bit line of higher voltage to a change to higher level and causes the potential of a bit line of lower voltage to a change to lower level. As a result, the difference voltage between the bit lines BLn, BLXn is amplified to a level difference between the power supply voltages vcc and Vss. Namely, the sense amplifier SAn detects data read out from the selected memory cell, amplifies the data and latches the amplified data.

In this case, to ensure a stable operation, both the read operation and the write operation are generally carried out after the sense amplifier is activated. This is because, for example, where the write operation is carried out before the sense amplifier is activated, the write current flows into the drive signal lines PSA and NSA.

Referring back to FIG. 1, reference 19 denotes a write amplifier circuit for effecting data writing. The write amplifier circuit 19 is constituted by: an inverter $IV_2$ responsive to a write amplifier activation signal $\phi_{WE}$; NOR (Not-OR) gates $NO_1$ and $NO_2$ responsive to an output of the inverter $Iv_2$, and complementary write data D and DX, respectively; inverters $IV_3$ and $IV_4$ responsive to outputs of the NOR gates $NO_2$ and $NO_1$, respectively; a p-channel transistor $Q_{15}$ and an n-channel transistor $Q_{16}$ connected in series between the power supply lines Vcc and Vss, each responsive to an output of the inverter $IV_3$ and the output of the NOR gate $NO_1$, respectively; and a p-channel transistor $Q_{17}$ and an n-channel transistor $Q_{18}$ connected in series between the power supply lines Vcc and Vss, each responsive to an output of the inverter $IV_4$ and the output of the NOR gate $NO_2$, respectively. Each drain of the transistors $Q_{18}$ and $Q_{18}$ is connected to one of complementary data lines (DB) and each drain of the transistors $Q_{17}$ and $Q_{18}$ is connected to another thereof (DBX).

In the above constitution, the data write operation is carried out as follows: First, according to the input complementary write data D and DX, the write amplifier circuit 19 which has been activated by the write amplifier activation signal $\phi_{WE}$ causes each potential of the complementary data lines DB and DBX to be amplified to "H" level (or "L" level) and "L" level (or "H" level), respectively. Next, when a potential of a column selection line CLn selected by a column address input is changed to "H" level, a column gate circuit (transfer gate transistors $Q_5$, $Q_6$) is activated to connect the corresponding sense amplifier SAn to the complementary data lines DB, DBX.

As previously mentioned, the current drive ability of the data bus drive transistors $Q_{15}$ to $Q_{18}$ in the write amplifier circuit 19 is generally designed to be much higher than that of the transistors $Q_1$ to $Q_4$ constituting the individual sense amplifier SAn. In view of this, the prior art DRAM device carries out its write operation utilizing the difference between the current drive abilities.

Where the device writes data of a logical level the same as data latched in the sense amplifier SAn, there is no problem. There is posed a problem, however, where the device writes data of a logical level opposite to data latched in the sense amplifier SAn. Namely, the device must invert the latched state of the sense amplifier with the sense amplifier being activated. Accordingly, part of the write current fed from the write amplifier circuit 19 leaks through the activated sense amplifier until the latched state of the sense amplifier is perfectly inverted. This results in problems in that power is uselessly dissipated, and that it takes considerable time to invert the latched state of the sense amplifier.

Next, the preferred embodiment of the present invention will be explained with reference to FIGS. 2 to 5.

Figure 2:
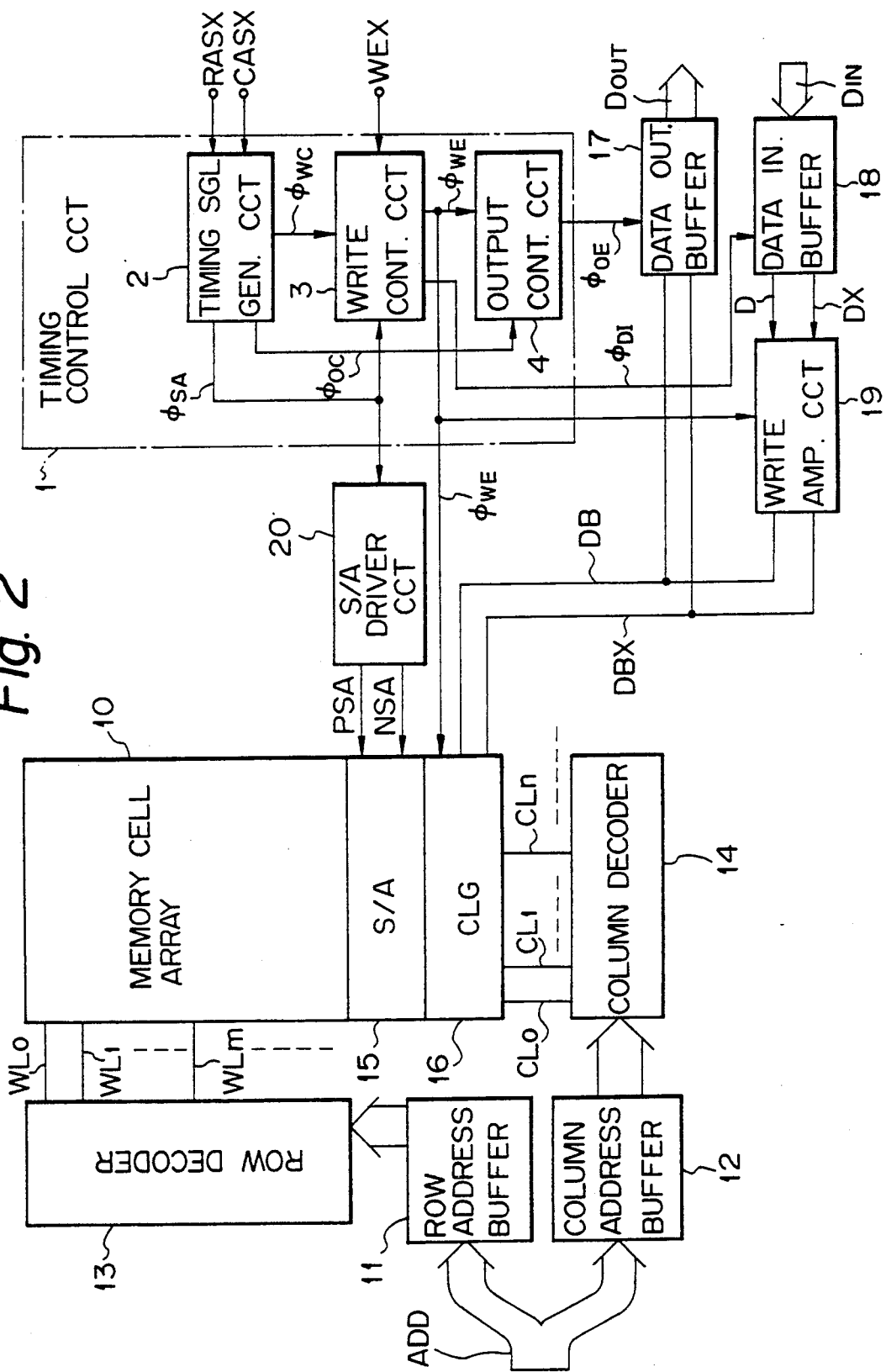
FIG. 2 is a block diagram showing a constitution of the DRAM device according to an embodiment of the present invention.

FIG. 2 illustrates a constitution of the DRAM device as an embodiment of the present invention.

In the illustration, reference 1 denotes a timing control circuit including a timing signal generating circuit 2, a write control circuit 3 and an output control circuit 4. The timing signal generating circuit 2 responds to an active low row address strobe signal RASX and an active low column address strobe signal CASX fed from the outside of the device, and generates a sense amplifier activation signal $\phi_{SA}$, an internal write amplifier activation signal $\phi_{WC}$ and an internal output enable signal $\phi_{OC}$. The write control circuit 3 responds to the sense amplifier activation signal $\phi_{SA}$, the internal write amplifier activation signal $\phi_{WC}$ and an active low write enable signal WEX fed from the outside of the device, and generates a write amplifier activation signal $\phi_{WE}$ and a data input control signal $\phi_{DI}$. Also, the output control circuit 4 responds to the write amplifier activation signal $\phi_{WE}$ and the internal output enable signal $\phi_{OC}$, and generates an output enable signal $\phi_{OE}$.

Figure 3:
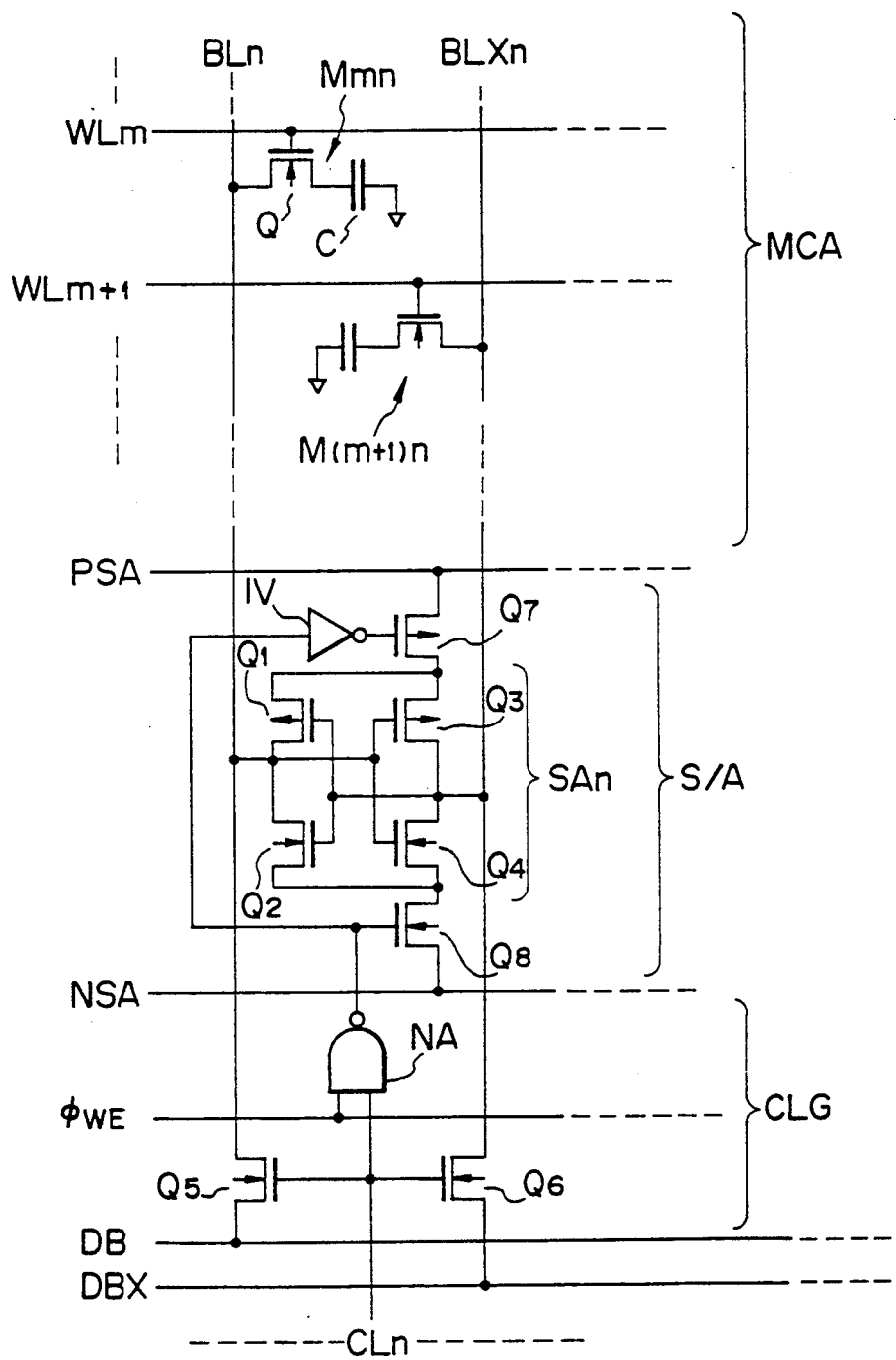
FIG. 3 is a circuit diagram showing a constitution corresponding to one column of the sense amplifier circuit, the column gate circuit and the memory cell array shown in FIG. 2.

Reference 10 denotes a memory cell array (MCA) including memory cells provided in the form of a matrix along a plurality of word lines WLi (i=0,1,, . . . ,m, . . . ) and a plurality of pairs of bit lines (one pair is shown by references BLn, BLXn in FIG. 3). As shown in FIG. 3, each memory cell Mij has the form of a DRAM cell of one transistor (Q) and one capacitor (C) type. Also, reference 11 denotes a row address buffer responsive to a plurality of bits of upper the rank side of an address signal ADD to and effecting a buffering thereof; reference 12 a column address buffer responsive to a plurality of bits of the lower rank side of the address signal ADD to and effecting a buffering thereof; reference 13 a row decoder for decoding the row address fed from the row address buffer 11 and selecting one of the plurality of word lines WLi; and reference 14 a column decoder for decoding the column address fed from the column address buffer 12 and selecting one of the plurality of column selection lines CLj.

Also, reference 15 denotes a sense amplifier circuit (S/A) for amplifying data read out from memory cells connected to a selected word line. The sense amplifier circuit 15 includes a sense amplifier SAn for each column, as shown in FIG. 3. Reference 16 denotes a column gate circuit (CLG), which responds to an activation of a selected column line CLj ("H" level) and connects the corresponding sense amplifier to the complementary data lines DB, DBX. The column gate circuit 16 also has the function of bringing the corresponding sense amplifier to an inactivated state in response to the write amplifier activation signal $\phi_{WE}$ in the data write operation. Also, reference 17 denotes a data output buffer which effects a buffering of data on the data lines DB, DBX in response to the output enable signal $D_{OE}$ and outputs the buffered data as an output data $D_{OUT}$, and reference 18 denotes a data input buffer which effects a buffering of an input data $D_{IN}$ and outputs the buffered data as complementary write data D and DX.

Reference 19 denotes a write amplifier circuit which amplifies the complementary data D and DX in response to the write amplifier activation signal $\phi_{WE}$ and outputs the amplified data to the data lines DB and DBX. Also, reference 20 denotes a S/A driver circuit which drives the drive signal lines PSA and NSA in response to the sense amplifier activation signal $\phi_{SA}$ and thus drives the sense amplifier circuit (S/A) 15. Respective constitutions of the write amplifier circuit 19 and the S/A driver circuit 20 are the same as those shown in FIG. 1.

FIG. 3 illustrates a circuit constitution corresponding to one column of the sense amplifier circuit (S/A) 15, the column gate circuit (CLG) 16 and the memory cell array (MCA) 10.

The column gate circuit (CLG) portion includes, in addition to the transfer gate transistors $Q_5$, $Q_6$ shown in FIG. 1, a NAND (Not-AND) gate NA responsive to the write amplifier activation signal $\phi_{WE}$ and a signal on the column selection line CLn. Also, the sense amplifier circuit (S/A) portion includes, in addition to the sense amplifier SAn shown in FIG. 1, an inverter IV, a p-channel transistor $Q_7$ and an n-channel transistor $Q_8$. The inverter IV responds to an output of the NAND gate NA. The p-channel transistor $Q_7$ is connected between the drive signal line PSA and each source of the p-channel transistors $Q_1$, $Q_8$ in the sense amplifier SAn and responds to an output of the inverter Iv. Also, the n-channel transistor $Q_8$ is connected between the drive signal line NSA and each source of the n-channel transistors $Q_2$, $Q_4$ in the sense amplifier SAn and responds to the output of the NAND gate NA.

Figure 4:
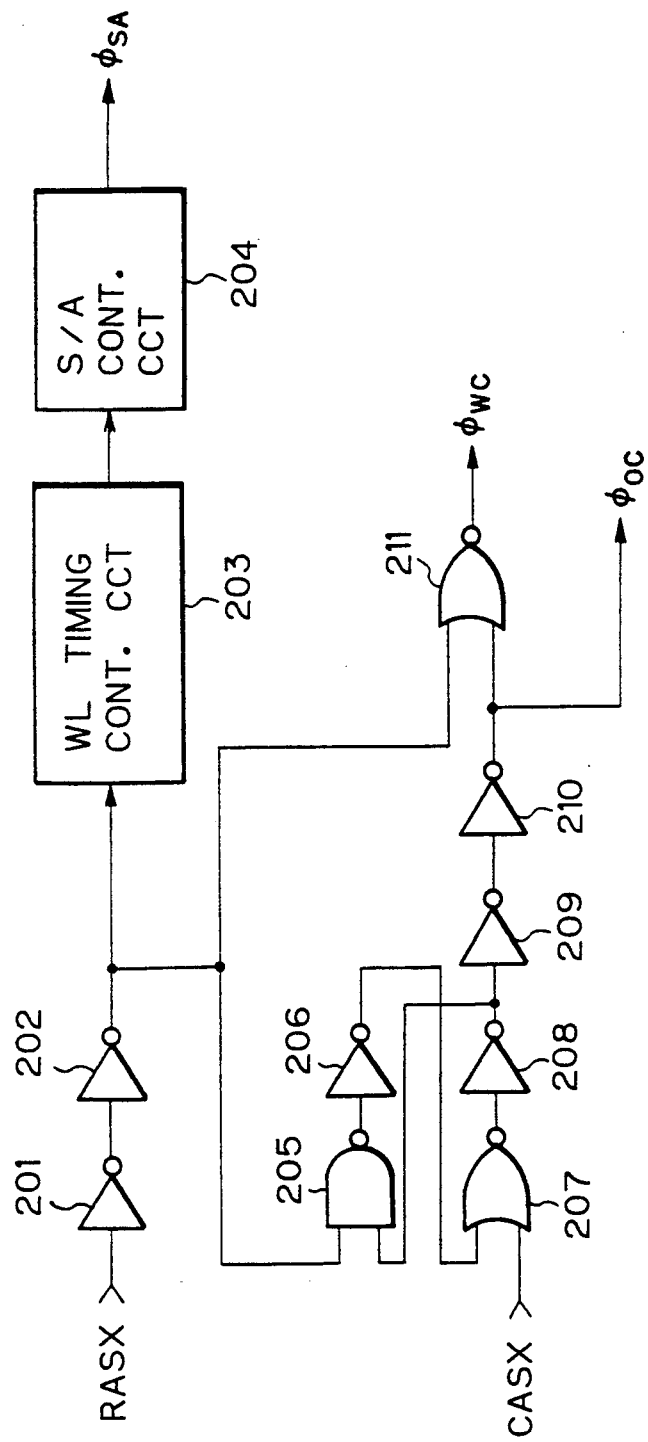
FIG. 4 is a circuit diagram showing a constitution of the timing signal generating circuit shown in FIG. 2.

FIG. 4 illustrates a constitution of the timing signal generating circuit 2 shown in FIG. 2.

The illustrated circuit is constituted by: an inverter 201 responsive to the row address strobe signal RASX; an inverter 202 responsive to an output of the inverter 201; a word line (WL) timing control circuit 203 responsive to an output of the inverter 202; a sense amplifier (S/A) control circuit 204 responsive to an output of the WL timing control circuit 203 and outputting the sense amplifier activation signal $\phi_{SA}$; a NAND gate 205 responsive to the output of the inverter 202 and an output of an inverter 208; an inverter 206 responsive to an output of the NAND gate 205; a NOR gate 207 responsive to an output of the inverter 206 and the column address strobe signal CASX; the inverter 208 responsive to an output of the NOR gate 207; an inverter 209 responsive to the output of the inverter 208; an inverter 210 responsive to an output of the inverter 209 and outputting the internal output enable signal $\phi_{OC}$; and a NOR gate 211 responsive to the output of the inverter 202 and an output of the inverter 210 and outputting the internal write amplifier activation signal $\phi_{WC}$.

Figure 5:
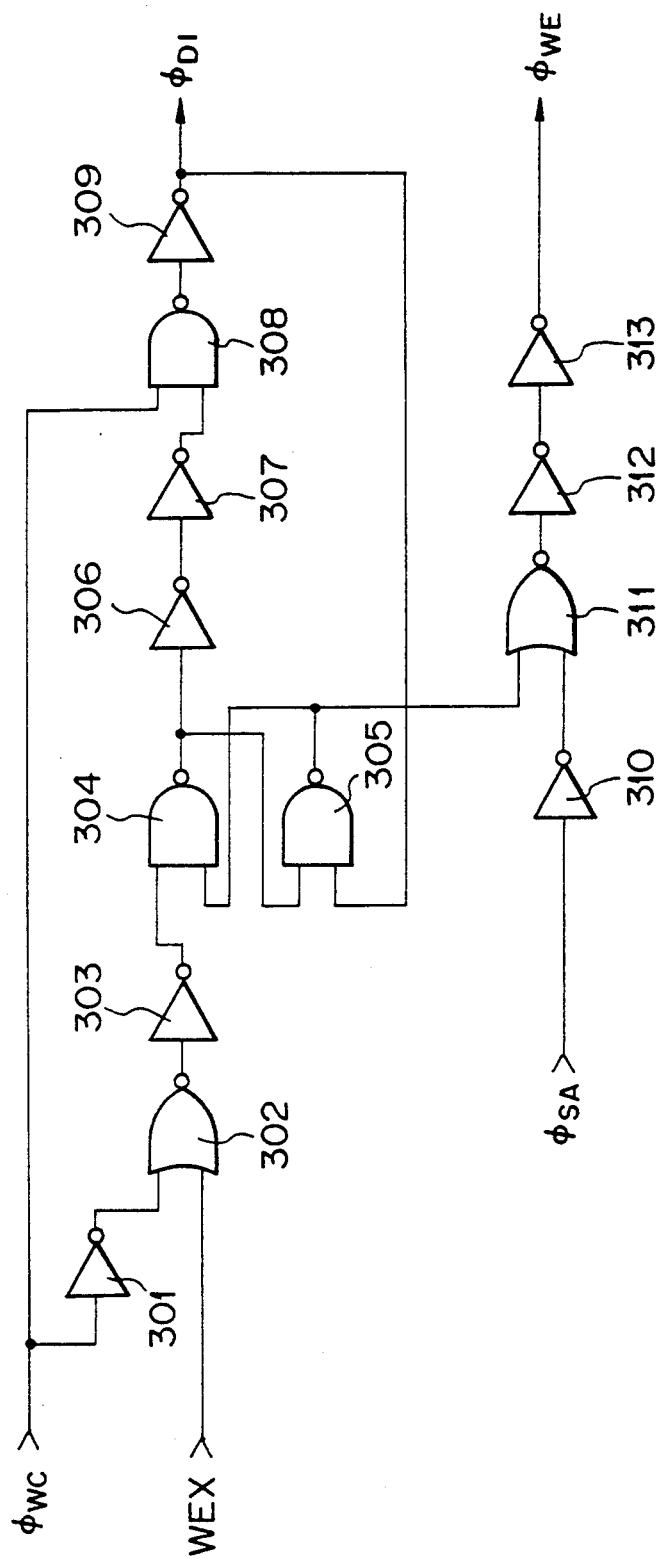
FIG. 5 is a circuit diagram showing a constitution of the write control circuit shown in FIG. 2.

FIG. 5 illustrates a circuit constitution of the write control circuit 3 shown in FIG. 2.

The illustrated circuit is constituted by: an inverter 301 responsive to the internal write amplifier activation signal $\phi_{WC}$; a NOR gate 302 responsive to an output of the inverter 301 and the write enable signal WEX; an inverter 303 responsive to an output of the NOR gate 302; a NAND gate 304 responsive to an output of the inverter 303 and an output of a NAND gate 305; the NAND gate 305 responsive to an output of the NAND gate 304 and an output of an inverter 309; an inverter 306 responsive to the output of the NAND gate 304; an inverter 307 responsive to an output of the inverter 306; a NAND gate 308 responsive to an output of the inverter 307 and the internal write amplifier activation signal $\phi_{WC}$; an inverter 309 responsive to an output of the NAND gate 308 and outputting the data input control signal $\phi_{D1}$; an inverter 310 responsive to the sense amplifier activation signal $\phi_{SA}$; a NOR gate 311 responsive to an output of the inverter 310 and the output of the NAND gate 305; an inverter 312 responsive to an output of the NOR gate 311; and an inverter 313 responsive to an output of the inverter 312 and outputting the write amplifier activation signal $\phi_{WE}$.

In the above constitution, the data write operation is carried out as follows: Namely, when the write amplifier activation signal $\phi_{WE}$ is changed to "H" level and the signal on the selected column selection line CLn is changed to "H" level, the output of the NAND gate NA is changed to "L" level and thus the output of the inverter IV is changed to "H" level. Accordingly, the transistors $Q_7$ and $Q_8$ are both cut off. As a result, the sense amplifier SAn connected to the bit lines BLn, BLXn corresponding to the selected memory cell is brought to an inactivated state. On the other hand, since the transfer gate transistors $Q_5$, $Q_6$ are turned ON by the "H" level signal on the column selection line CLn, the corresponding complementary bit lines BLn and BLXn are connected to the complementary data lines DB and DBX, respectively.

Thus, it is possible to use all of the write current fed from the write amplifier circuit 19 in the write operation to thereby amplify levels of the complementary bit lines BLn, BLXn in phase with the write data on the complementary data lines DB, DBX. In other words, it is possible to remove useless dissipation of the write current in the data write operation and thereby decrease power dissipated in the entire DRAM device.

Also, since the sense amplifier SAn is inactivated even in the write operation of data of a logical level opposite to data latched in the sense amplifier SAn, it is possible to solve the problem, as seen in the prior art, in that part of the write current leaks through an activated sense amplifier. Accordingly, it is possible to reduce time required for inverting the latched state of the sense amplifier. As a result, respective signal levels of the complementary bit lines BLn, BLXn can be rapidly changed according to the write data on the complementary data lines DB, DBX. This contributes to a high speed write operation.

Figure 6:
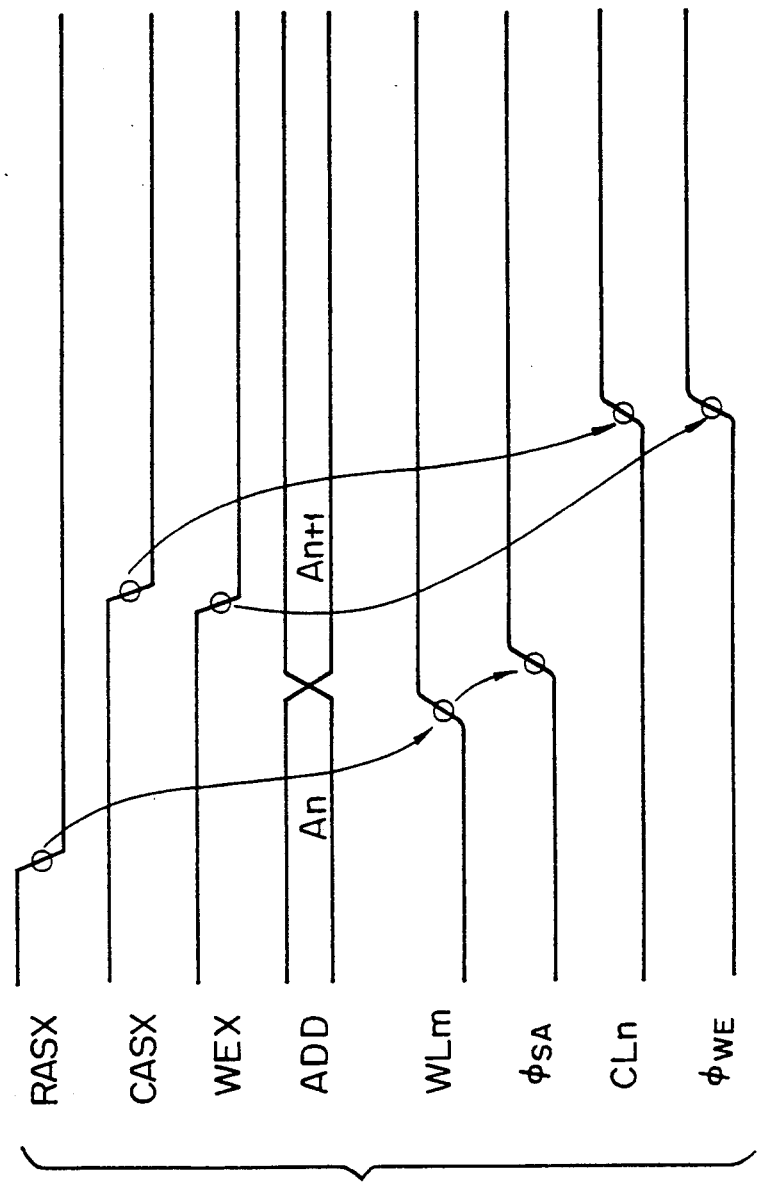
FIG. 6 is a timing chart for explaining the operation of the DRAM device in FIG. 2.

For reference, the relationship between respective signals pertaining to the operation of the present DRAM device is shown in the timing chart of FIG. 6.

Although the present invention has been disclosed and described by way of one embodiment, it is apparent to those skilled in the art that other embodiments and modifications of the present invention are possible without departing from the spirit or essential features thereof.

We claim:
1. A semiconductor memory device comprising:
a memory cell array including a plurality of memory cells provided in the form of a matrix along a plurality Of word lines and a plurality of pairs of bit lines;
a plurality of sense amplifiers operatively connected to the plurality of pairs of bit lines; and
sense amplifier control means operatively connected to the plurality of sense amplifiers, when one of the plurality of memory cells is selected and data writing is carried out to the selected memory cell, for selectively inactivating only a sense amplifier, corresponding to the selected memory cell among the plurality of sense amplifiers.

2. A semiconductor memory device as set forth in claim 1, further comprising first and second transistors for connecting each pair of the plurality of pairs of bit lines to a pair of complementary data lines in response to a corresponding column selection signal, wherein the sense amplifier control means comprises a pair of drive signal lines for driving the plurality of sense amplifiers, third and fourth transistors connected between the pair of drive signal lines and each sense amplifier, respectively, and a gate circuit for controlling ON/OFF operations of the third and fourth transistors in response to the corresponding column selection signal and a control signal which is activated in the write operation, whereby both the control signal and the column selection signal corresponding to a memory cell selected in the data write operation are activated to thereby bring the first and second transistors to an ON state and bring the third and fourth transistors to an OFF state.

3. A semiconductor memory device as set forth in claim 2, wherein the gate circuit includes a NAND gate responsive to the corresponding column selection signal and the control signal which is activated in the write operation, and an inverter responsive to an output of the NAND gate, an output of the inverter and the output of the NAND gate being applied to each gate of the third and fourth transistors, respectively.

4. A semiconductor memory device as set forth in claim 3, further comprising:

a sense amplifier driver circuit, responsive to a sense amplifier activation signal, for driving the pair of drive signal lines and thus driving a sensor amplifier corresponding to one of the plurality of memory cells selected for data reading or writing;

a write amplifier circuit, responsive to the control signal which is activated in the write operation, for amplifying complementary data input from an outside of the device and transmitting the amplified data to the pair of complementary data lines; and a timing control circuit, responsive to a row address strobe signal, a column address strobe signal and a write enable signal, for generating the sense amplifier activation signal and the control signal.

5. A semiconductor memory device as set forth in claim 4, wherein the timing control circuit comprises:

a timing signal generating circuit, responsive to the row address strobe signal and the column address strobe signal, for generating the sense amplifier activation signal, an internal write amplifier activation signal and an internal output enable signal;

a write control circuit, responsive to the sense amplifier activation signal, the internal write amplifier activation signal and the write enable signal, for generating a write amplifier activation signal which is the control signal and a data input control signal; and an output control circuit to responsive to the write amplifier activation signal and the internal output enable signal, for generating an output enable signal.

6. A semiconductor memory device as set forth in claim 1, wherein each of the plurality of memory cells has the form of a dynamic cell of one transistor and one capacitor type.

* * * * *